(12) United States Patent
Smith

(10) Patent No.: US 7,173,488 B2
(45) Date of Patent: Feb. 6, 2007

(54) VACUUM TUBE POWER AMPLIFIER SWITCHABLE BETWEEN PUSH-PULL AND SINGLE ENDED CONFIGURATIONS

(75) Inventor: Randall C. Smith, Petaluma, CA (US)

(73) Assignee: Mesa Boogie, Petaluma, CA (US)

( * ) Notice: Subject to any disclaimer, the term of this patent is extended or adjusted under 35 U.S.C. 154(b) by 100 days.

(21) Appl. No.: 10/893,177

(22) Filed: Jul. 19, 2004

(65) Prior Publication Data

US 2006/0012423 A1   Jan. 19, 2006

(51) Int. Cl.
*H03F 3/30* (2006.01)

(52) U.S. Cl. ...................... 330/119; 330/276

(58) Field of Classification Search ............... 330/119, 330/262, 3, 118, 276; 341/3, 119, 121, 122, 341/123
See application file for complete search history.

(56) References Cited

U.S. PATENT DOCUMENTS 3,254,302 A * 5/1966 Boykin et al. ............. 330/276
4,593,251 A    6/1986 Smith
5,091,700 A    2/1992 Smith
5,168,438 A   12/1992 Smith
6,111,931 A    8/2000 Hedrick et al.
6,140,870 A   10/2000 Cook
6,895,227 B1 * 5/2005 Moliere ..................... 330/286
6,937,093 B2 * 8/2005 Tekushan ................... 330/119

FOREIGN PATENT DOCUMENTS

DE    11 06 374 B      5/1961
DE    43 00 963 A1     1/1992
WO    WO 00/21202    * 4/2000

OTHER PUBLICATIONS

Aspen, Pittman: The Tube Amp Book. vol. 3, Grooves Tubes, GtElectronics, Sylmar, USA, 1991, S.44-45.
DE Search Report from a corresponding foreign application, Application No. 10,2005,033646.9 dated Feb. 16, 2006.

* cited by examiner

*Primary Examiner*—Henry Choe
(74) *Attorney, Agent, or Firm*—James D. Ivey

(57) ABSTRACT

A vacuum tube power amplifier with a user-operable switch and a single output transformer which selectively provides push-pull or single ended configurations for driving a loudspeaker.

20 Claims, 1 Drawing Sheet

VACUUM TUBE POWER AMPLIFIER SWITCHABLE BETWEEN PUSH-PULL AND SINGLE ENDED CONFIGURATIONS

FIELD OF THE INVENTION

This invention relates to the use of vacuum tubes in audio power amplifiers, particularly for use in conjunction with an electric guitar.

BACKGROUND AND BRIEF DESCRIPTION OF THE PRIOR ART

Vacuum tube audio amplifiers generally utilize push-pull output configurations as the most economical method of producing ample power. The benefits of push-pull are well known in the art and require no repetition herein. It is sufficient to say that commercial amplifiers offering power levels even as low as 15 watts will use a push-pull pair of output tubes, though one larger tube in a single-ended configuration could also provide similar power. It can be safely asserted that virtually all commercial audio amplifiers providing more than 20 watts are of the push-pull variety.

In contrast, single-ended vacuum tube output sections have previously been used mostly in 5 to 8 watt so-called "beginner" guitar amplifiers, which offer a stark economy of overall design. Nevertheless, such low powered units occasionally find favor in recording studios or small apartment-sized venues. In such circumstances, their lower power can become a virtue, providing desirable "power amplifier clip" at low volume levels. Many guitarists claim distortion generated in the power section is more legitimate (due to its historical roots), and is more musically pleasing compared to preamplifier overdrive saturation.

Without discussion of the relative merits of the two, power amplifier distortion remains dependent on the power capability provided and therefore suffers from a lack of versatility regarding loudness. The desired distortion characteristics and the output loudness of an amplifier are so intimately related as to be inseparable and overcoming that limitation is what initially spurred the creation of cascading preamplifier gain structures with separate gain and level attenuation, such as shown in the Smith U.S. Pat. No. 4,211,893, the contents of which are incorporated herein by reference.

The guitar amplifier design as demonstrated by Smith U.S. Pat. No. 4,211,893 ushered in the "modern era" of guitar amplification and provided the live musician with the ability to set a high-gain sound rich in distortion characteristics independent of its volume level and the ability to switch alternately and selectively to an undistorted clean sound. In order to achieve this goal, distortion is created within the preamplifier section via overdrive saturation, and though it may mimic power amplifier clip, the two are not the same.

As playing styles and circumstances have evolved over the years, a greater emphasis is now placed on recording, particularly home recording, and on live performance venues of small to medium size. In the prior art, an amplifier capable of producing genuine power amplifier distortion at a volume suitable for home recording or practicing would not be usable in a live performance and vice versa.

SUMMARY OF THE INVENTION

In accordance with the present invention, the limitations of the prior art are overcome by offering musically desirable power section distortion at a plurality of power and loudness settings. The same amplifier can be reconfigured at the flip of a switch to provide ample power for "gigging" as live performances in its push-pull mode, or have substantially reduced power to provide rich, single-ended power clip for recording or practicing at modest volume levels.

Moreover, in accordance with the present invention, there is provided in a single amplifier both of the differing harmonic tonal characteristics of push-pull and single-ended which may be selected by the musician. Unlike single-ended audio amplifier configurations, push-pull circuits inherently cancel second order distortion harmonics. A sound rich in second harmonic, such as produced by a good single-ended unit, can be characterized as warm and velvety, and as the loudness and distortion are increased, the single-ended distortion stays "glued' to the note, giving it notable "fatness" and touch sensitive dynamic nuance. These are desirable characteristics not only for immediate player satisfaction, but, in addition, their subtleties are able to record well.

In contrast, push-pull power sounds much louder due to its relative absence of second harmonic. With its emphasis on third and higher order harmonics predominating, push-pull is sonically better able to cut through the mix of a live band. Furthermore, a pair of tubes in a push-pull configuration will easily provide a three fold increase in undistorted output wattage compared to a single tube of the same type utilizing the same power supply.

Unfortunately, there are serious technical obstacles that, until the present invention, have prevented successful switching between push-pull and single-ended construction. In a single-ended output, the iron core of the output transformer must include a "gap" to prevent flux saturation by the DC current. Such a gap is an integral structural element of the iron laminations and is achieved by either sawing a small gap in the core or by separating the E and I laminations with an insulator. In a push-pull transformer, such a gap is neither required nor desired. Because DC enters the transformer primary at the center tap and flows equally through both halves, DC core flux is symmetrical, balanced and self-neutralizing. Unfortunately, accommodating single-ended operation by including a gap in the core of a push-pull transformer greatly reduces its magnetic flux capability and causes low frequency roll-off and a general loss of efficiency.

After studying this difference at length, the present invention overcomes this structural transformer limitation while simultaneously solving the problems of providing appropriate drive, signal and balance conditions for both single-ended and push-pull operation.

BRIEF DESCRIPTION OF THE DRAWINGS

Figure 1:
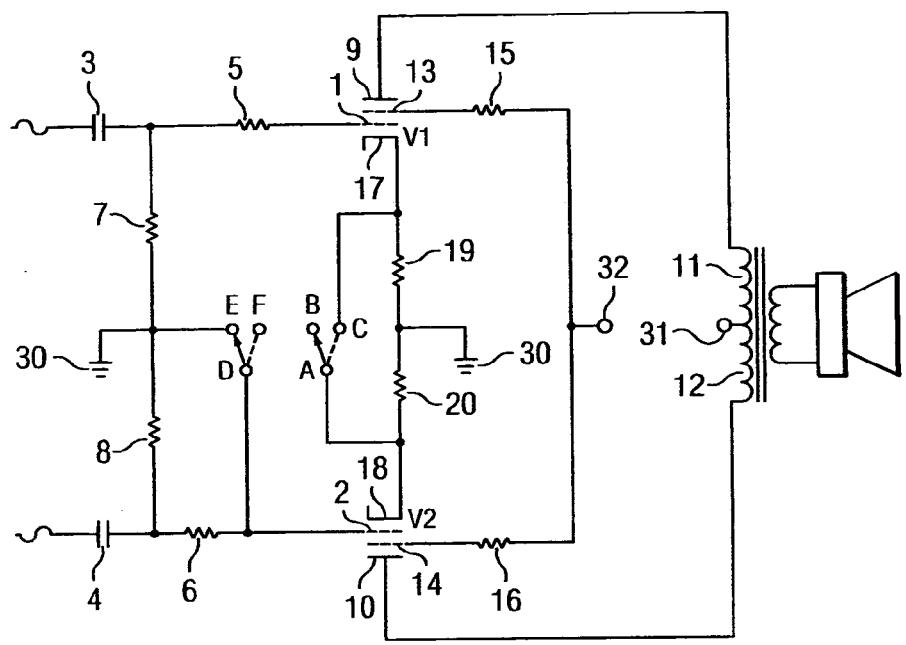
FIG. 1 is a schematic diagram of a simplified first embodiment of a circuit illustrating the principles of switching between push-pull and single-ended operation within the same amplifier in accordance with the present invention.

Referring to FIG. 1, opposing phase push-pull AC signals are provided for the signal grids 1, 2 of vacuum tube power pentodes V1 and V2 respectively. The AC signals are coupled through blocking capacitors 3, 4 and grid stop resistors 5, 6. Grid leak resistors 7, 8 provide DC reference to ground 30 for the grids 1, 2. Anodes 9, 10 of pentodes V1 and V2 are fed DC high voltage through respective halves of the output of transformer primary winding 11, 12. DC voltage from the power supply (not shown) enters the output transformer primary winding 11, 12 through center tap 31. Screen grids 13, 14 are coupled to the high voltage DC source at 32 via current limiting resistors 15 and 16. Cathodes 17, 18 are coupled to ground 30 through respective cathode bias resistors 19, 20. Switches A, B, C and D, L, F operate in conjunction with each other and may be a double pole double throw (DPDT) relay device. When configured as shown by the arrows, connection D to L effectively grounds the grid 2 of tube V2, thereby shunting any drive signal and preventing the drive signal form appearing on the grid 2. It should be understood that, in an amplifier with a fixed DC bias arrangement, a capacitor may be used for AC signal shunting, thereby preserving the DC bias to the grid 2. Simultaneous with shunting drive signal away from grid 2, switch A, B, C also in the position indicated by the arrow, decouples the cathodes 17 and 18 from one another. This prevents the power tube V2 from being cathode driven by tube V1 in what would be a grounded-grid amplifier and prevents tube V2 from continuing to operate as half of a push-pull arrangement. Therefore, when the pair of switches A, B, C plus D, E, F is configured as shown by the arrows, the circuit of FIG. 1 will operate in single ended configuration. The two cathodes 17, 18 of the power tubes V1 and V2 are then independently biased through resistors 19 and 20 such that amplification occurs in tube V1 only while tube V2 operates as a DC current sink. No AC component or amplification is allowed, with DC flux currents in the two halves of the output transformer primary winding 11, 12 remaining substantially equal and balanced.

DESCRIPTION OF THE PREFERRED EMBODIMENTS

Referring to FIG. 1, opposing phase push-pull AC signals are provided for the signal grids 1, 2 of vacuum tube power pentodes V1 and V2 respectively. The AC signals are coupled through blocking capacitors 3, 4 and grid stop resistors 5, 6. Grid leak resistors 7, 8 provide DC reference to ground 30 for the grids 1, 2. Anodes 9, 10 of pentodes V1 and V2 are fed DC high voltage through respective halves of the output of transformer primary winding 11, 12. DC voltage from the power supply (not shown) enters the output transformer primary winding 11, 12 through center tap 31. Screen grids 13, 14 are coupled to the high voltage DC source at 32 via current limiting resistors 15 and 16. Cathodes 17, 18 are coupled to ground 30 through respective cathode bias resistors 19, 20. Switches A, B, C and D, E, F operate in conjunction with each other and may be a double pole double throw (DPDT) relay device. When configured as shown by the arrows, connection D to E effectively grounds the grid 2 of tube V2, thereby shunting any drive signal and preventing the drive signal form appearing on the grid 2. It should be understood that, in an amplifier with a fixed DC bias arrangement, a capacitor may be used for AC signal shunting, thereby preserving the DC bias to the grid 2. Simultaneous with shunting drive signal away from grid 2, switch A, B, C also in the position indicated by the arrow, decouples the cathodes 17 and 18 from one another. This prevents the power tube V2 from being cathode driven by tube V1 in what would be a grounded-grid amplifier and prevents tube V2 from continuing to operate as half of a push-pull arrangement. Therefore, when the pair of switches A, B, C plus D, E, F is configured as shown by the arrows, the circuit of FIG. 1 will operate in single ended configuration. The two cathodes 17, 18 of the power tubes V1 and V2 are then independently biased through resistors 19 and 20 such that amplification occurs in tube V1 only while tube V2 operates as a DC current sink. No AC component or amplification is allowed, with DC flux currents in the two halves of the output transformer primary winding 11, 12 remaining substantially equal and balanced. [Is this what permits use of a transformer without a gap?]

When the switches A, B, C, plus D, E, F are configured as shown by the dashed lines, balanced push-pull operation results. By removing the shunt D–E, drive signal is allowed to couple to the grid 2 of tube V2. By connecting A to C, the cathodes 17, 18 are coupled together and both are biased simultaneously through the parallel network of resistors 19, 20. By coupling together the cathodes 17, 18, improved balance is achieved between the separate power tubes V1 and V2 while operating push-pull.

Figure 2:
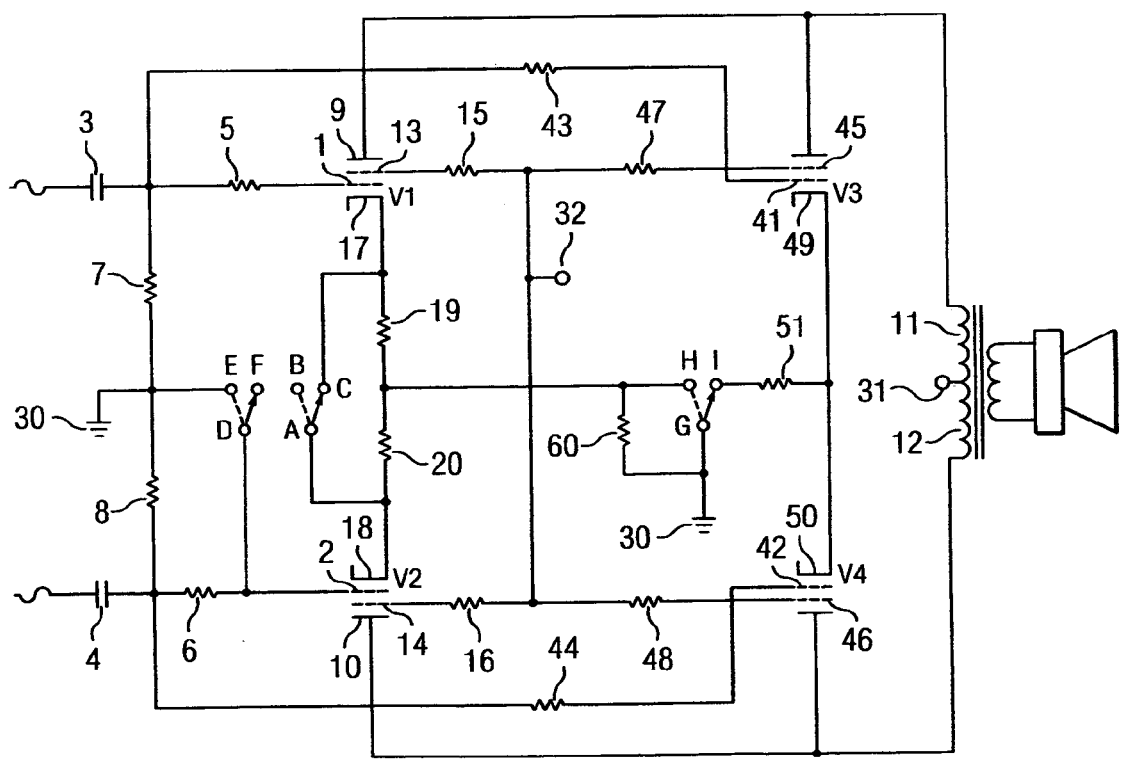
FIG. 2 is a schematic diagram of an expanded second embodiment of a circuit in accordance with the present invention which, by adding an additional pair of output tubes shows an amplifier with three distinctly different power levels in addition to providing the ability to switch between single-ended and push-pull operation.

In the second embodiment of FIG. 2, there are shown all the same elements operating in identical fashion as describe in FIG. 1, however an additional pair of power tubes V3 and V4 is also provided. An additional switch G, H, I is utilized such that this second pair of power tubes V3, V4 may be switched on in parallel with the first pair, V1, V2, to offer a third level of output power. As is conventional in a push-pull parallel amplifier, drive signal is coupled to grids 41, 42 through grid stop resistors 43 and 44 to prevent oscillation. Screen grids 45, 46 are fed from high voltage DC supply 32 through resistors 47, 48 to stabilize the circuit and limit screen dissipation under conditions of heavy clip. Cathodes 49, 50 are connected together and biased to ground 30 through resistor 51 when the switch G, H, I is configured as shown by the arrow.

An added enhancement to the preferred embodiment amplifier of FIG. 2 would be its operation in conjunction with a power supply such as described in Ser. No. 10/376, 338, the contents of which are incorporated herein by reference. In that disclosure, the power supply automatically switches to provide optimum power delivery to an amplifier with selectable output devices as various devices are added.

In the case of the amplifier of FIG. 2 employing two of the popular 6BQ5/EL-84 power pentodes, for example, and working together with a version of such an improved power supply, the following would occur: In the lowest power position, the amplifier would be configured for single-ended operation and fed a somewhat reduced DC high voltage by the power supply, utilizing its vacuum tube rectifier and/or a voltage dropping resistor. This reduced plate voltage enables the single tube to be biased for heavier current draw such that operation is centered around the mid-point of its linear region and pure Class A operation ensues. Power produced at the onset of clip is a very rich sounding 4 watts, perfect for recording or soft practicing. Switching the amplifier to operate push-pull on a single pair of output tubes, while still utilizing the slightly lower DC voltage as provided by the tube rectifier and/or resistor, will produce about 12 watts of punchy, pure Class A push-pull power. Finally, at its highest output configuration, the second pair of push-pull power pentodes comes on line in parallel with the first pair while the B+ operating voltage is simultaneously increased by the above described power supply automatically switching to silicon diode rectifiers.

Referring again to FIG. 2, it will be seen that when the switch G, H, I turns on the second pair of push-pull tubes V3, V4 (as shown by the arrow), it simultaneously provides for resistor 60 to come into series with the parallel network of bias resistors 19, 20 such that the first pair of output tubes V1, V2 is re-biased to accommodate the higher B+ voltage now supplied. Total output before clip then can exceed 30 watts to provide an amplifier capable of playing mid-size venues.

Though the invention has been described with reference to the specific preferred embodiments thereof, many variations and modifications will immediately become apparent to those skilled in the art. For example, a load resistor could be substituted in place of the tube V2 to provide DC flux balance through the transformer primary during single-ended operation. However, the tube as shown would still be required for push-pull power. A further possible refinement could be the inclusion of a tapped secondary winding in the output transformer combined with a switch to provide more correct impedance matching under varying conditions. It is therefore the intention that the appended claims be interpreted as broadly as possible in view of the prior art to include all such variations and modification.

The invention claimed is:

1. A guitar amplifier comprising:
a transformer-coupled push-pull amplifier capable of single ended configuration; and
switch means to reversibly convert said push-pull amplifier from push-pull to single ended configuration;
wherein the push-pull amplifier is configured to amplify audio frequency signals and includes at least two vacuum tubes.

2. The amplifier of claim 1 wherein the push-pull amplifier includes a first pair of vacuum tubes in push-pull configuration, each vacuum tube of said first pair of vacuum tubes having a control grid, said switch means connecting the control grid of one of said first pair of vacuum tubes to a source of reference potential when said switch means is switched to provide said single ended configuration.

3. The amplifier of claim 2 wherein said first pair of vacuum tubes further each includes a screen grid, the screen grids of each of said first pair of vacuum tubes coupled to each other and to a source of DC potential.

4. The amplifier of claim 2 wherein said switch means couples together the cathodes of each of said first pair of vacuum tubes in the push-pull configuration and decouples said cathodes in the single ended configuration.

5. The amplifier of claim 3 wherein said first pair of vacuum tubes further each includes a screen grid, the screen grids of each of said first pair of vacuum tubes coupled to each other and to a source of DC potential.

6. The amplifier of claim 4 wherein said first pair of vacuum tubes further each includes a screen grid, the screen grids of each of said first pair of vacuum tubes coupled to each other and to a source of DC potential.

7. The amplifier of claim 2 further including a second pair of vacuum tubes in parallel with said first pair of vacuum tubes, in push-pull configuration, each vacuum tube of said second pair of vacuum tubes having a control grid, said switch means connecting the control grid of one of said second pair of vacuum tubes to said source of reference potential when said switch means is switched to provide said single ended configuration.

8. The amplifier of claim 7 wherein said second pair of vacuum tubes further each includes a screen grid, the screen grids of each of said second pair of vacuum tubes coupled to each other and to said source of DC potential.

9. The amplifier of claim 7 wherein said switch means couples together the cathodes of each of said second pair of vacuum tubes in the push-pull configuration and decouples said cathodes in the single ended configuration.

10. The amplifier of claim 9 wherein said second pair of vacuum tubes further each includes a screen grid, the screen grids of each of said second pair of vacuum tubes coupled to each other and to a source of DC potential.

11. The amplifier of claim 10 wherein said second pair of vacuum tubes further each includes a screen grid, the screen grids of each of said second pair of vacuum tubes coupled to each other and to a source of DC potential.

12. The amplifier of claim 1 further including means to provide a reduced plate voltage to the operating vacuum tube of said first pair of vacuum tubes when operating in the single ended configuration relative to the push-pull configuration.

13. The amplifier of claim 12 wherein said single ended configuration operates in Class A.

14. The amplifier of claim 7 further including resistive means coupled between the cathodes of said first and second pair of vacuum tubes and a reference voltage source.

15. An audio amplifier comprising:
a transformer-coupled push-pull amplifier capable of single ended configuration; and
switch means to reversibly convert said push-pull amplifier from push-pull to single ended configuration;
wherein the push-pull amplifier is configured to amplify audio frequency signals and includes at least two vacuum tubes.

16. The amplifier of claim 15 wherein the push-pull amplifier includes a first pair of vacuum tubes in push-pull configuration, each vacuum tube of said first pair of vacuum tubes having a control grid, said switch means connecting the control grid of one of said first pair of vacuum tubes to a source of reference potential when said switch means is switched to provide said single ended configuration.

17. The amplifier of claim 16 wherein said first pair of vacuum tubes further each includes a screen grid, the screen grids of each of said first pair of vacuum tubes coupled to each other and to a source of DC potential.

18. The amplifier of claim 16 wherein said switch means couples together the cathodes of each of said first pair of vacuum tubes in the push-pull configuration and decouples said cathodes in the single ended configuration.

19. The amplifier of claim 17 wherein said first pair of vacuum tubes further each includes a screen grid, the screen grids of each of said first pair of vacuum tubes coupled to each other and to a source of DC potential.

20. The amplifier of claim 18 wherein said first pair of vacuum tubes further each includes a screen grid, the screen grids of each of said first pair of vacuum tubes coupled to each other and to a source of DC potential.

* * * * *